(12) United States Patent
Lee et al.

(10) Patent No.: US 10,469,098 B2
(45) Date of Patent: Nov. 5, 2019

(54) NON-SWITCHED CAPACITOR CIRCUITS FOR DELTA-SIGMA ADCS

(71) Applicant: Omni Design Technologies Inc., Milpitas, CA (US)

(72) Inventors: Hae-Seung Lee, Lexington, MA (US); Denis Daly, Wellesley, MA (US)

(73) Assignee: Omni Design Technologies Inc., Milpitas, CA (US)

(*) Notice: Subject to any disclaimer, the term of this patent is extended or adjusted under 35 U.S.C. 154(b) by 0 days.

(21) Appl. No.: 16/272,499

(22) Filed: Feb. 11, 2019

(65) Prior Publication Data

US 2019/0253070 A1 Aug. 15, 2019

Related U.S. Application Data

(60) Provisional application No. 62/629,448, filed on Feb. 12, 2018.

(51) Int. Cl.
*H03M 3/00* (2006.01)
*H03H 19/00* (2006.01)

(52) U.S. Cl.
CPC .......... *H03M 3/496* (2013.01); *H03H 19/004* (2013.01); *H03M 3/362* (2013.01)

(58) Field of Classification Search
None
See application file for complete search history.

(56) References Cited

U.S. PATENT DOCUMENTS

| | | | | |
|---|---|---|---|---|
| 4,306,197 A | * | 12/1981 | Gregorian | H03H 19/004 330/107 |
| 4,633,425 A | * | 12/1986 | Senderowicz | H03F 3/005 341/143 |
| 6,617,908 B1 | * | 9/2003 | Thomsen | H03F 3/005 327/337 |

OTHER PUBLICATIONS

M.A.P. Pertijs et al., A CMOS Smart Temperature Sensor With a 3(Sigma) Inaccuracy of ±0.1° C. From -55° C. to 125° C., IEEE Journal of Solid-State Circuits, Dec. 2005, pp. 2805-2815, vol. 40, No. 12, IEEE.
R. Schreier et al., "Understanding Delta-Sigma Data Converters", First Edition, Nov. 8, 2004, 464 Pages, ISBN-13:978-0471465850, Wiley-IEEE Press.

\* cited by examiner

*Primary Examiner* — Howard Williams
(74) *Attorney, Agent, or Firm* — Intrinsic Law Corp.

(57) ABSTRACT

Integrator circuits comprising switched capacitors, non-switched capacitors, and an op amp. One embodiment is directed to an integrator circuit comprising an op amp having an inverting input, a non-inverting input, an inverting output and a non-inverting output, a first sampling capacitor and a first feedback capacitor, and a first non-switched capacitor. The first feedback capacitor is coupled between the inverting input and the non-inverting output of the op amp, and the first non-switched capacitor is coupled between the negative integrator input and the inverting input of the op amp. During a sampling phase, a positive integrator input is coupled to the first sampling capacitor, and during an integration phase, a charge sampled across the first sampling capacitor during the sampling phase is transferred to the first integration capacitor.

13 Claims, 11 Drawing Sheets

NON-SWITCHED CAPACITOR CIRCUITS FOR DELTA-SIGMA ADCS

RELATED APPLICATIONS

This application claims priority to U.S. Provisional Application No. 62/629,448, titled "Non-switched Capacitor Circuits for Delta-Sigma ADCS," filed on Feb. 12, 2018, which is hereby incorporated by reference.

TECHNICAL FIELD

This application relates generally to non-switched capacitor circuits for delta-sigma analog-to-digital converters.

BACKGROUND

Delta-sigma analog-to-digital (A/D) converters are widely used in applications that require high resolution at low to medium sampling rates. They lower quantization noise by the feedback loop in conjunction with oversampling. Higher order delta-sigma converters are more effective in suppressing quantization noise, hence requiring a lower oversampling ratio (OSR) for a given signal-to-noise ratio (SNR). However, delta-sigma converters with an order of 2 or more are not inherently stable, and thus require a careful design of the feedback loop for stability.

Delta-sigma converters can be realized in continuous-time form, discrete-time form, or as a hybrid of continuous-time and discrete-time forms. Continuous-time implementations have become popular in recent years due to their higher frequency capability and inherent anti-aliasing property. However, for precision applications, discrete-time switched-capacitor implementations provide much higher accuracy than continuous-time counterparts. Therefore, switched-capacitor implementations are preferred for high-precision, low frequency applications such as sensor interface circuits.

High order delta-sigma A/D converters are desirable because they provide high SNR at a low OSR, but they must be stabilized by at least one zero in the transfer function. Prior art delta-sigma converters employ feedback or feed-forward topologies to provide the zeros, for example as described in R. Schreier, et. al., "Understanding Delta-Sigma Data Converters," Wiley-IEEE Press; 1st edition (Nov. 8, 2004) ISBN-13:978-0471465850, which is hereby incorporated by reference. However, these prior art delta-sigma converters incur a penalty in additional circuitry such as additional digital-to-analog (D/A) converters or another operational amplifier.

It would be desirable to overcome one or more of the deficiencies in existing delta-sigma A/D converters.

SUMMARY

Example embodiments described herein have innovative features, no single one of which is indispensable or solely responsible for their desirable attributes. The following description and drawings set forth certain illustrative implementations of the disclosure in detail, which are indicative of several exemplary ways in which the various principles of the disclosure may be carried out. The illustrative examples, however, are not exhaustive of the many possible embodiments of the disclosure. Without limiting the scope of the claims, some of the advantageous features will now be summarized. Other objects, advantages and novel features of the disclosure will be set forth in the following detailed description of the disclosure when considered in conjunction with the drawings, which are intended to illustrate, not limit, the invention.

An aspect of the invention is directed to a differential integrator circuit operating in sampling and integration phases, comprising: a positive input voltage; a negative input voltage; an op amp having an inverting input, a non-inverting input, an inverting output, and a non-inverting output; a first sampling capacitor; a first integration capacitor; and a first non-switched capacitor, wherein the first integration capacitor is coupled between the inverting input and the non-inverting output of the op amp, the first non-switched capacitor is coupled between the negative input voltage and the inverting input of the op amp, during the sampling phase, the positive input voltage is coupled to the first sampling capacitor, and during the integration phase, a charge sampled across the first sampling capacitor during the sampling phase is transferred to the first integration capacitor.

In one or more embodiments, the differential integrator circuit further comprises a second sampling capacitor; a second integration capacitor; and a second non-switched capacitor, wherein: the second integration capacitor is coupled between the non-inverting input and the inverting output of the op amp, the second non-switched capacitor is coupled between the positive input voltage and the non-inverting input of the op amp, during the sampling phase, the negative input voltage is coupled to the second sampling capacitor, and during the integration phase, a charge sampled across the second sampling capacitor is transferred to the second integration capacitor.

In one or more embodiments, the differential integrator circuit further comprises a discrete-time integrator circuit having first and second outputs, wherein the first output is in electrical communication with the positive input voltage and the second output is in electrical communication with the negative input voltage. In one or more embodiments, the discrete-time integrator circuit is a delayless integrator. In one or more embodiments, the differential integrator circuit further comprises an analog-to-digital converter (ADC); and a digital-to-analog converter (DAC), wherein: the ADC is coupled to the inverting output and the non-inverting output of the op amp, and an output of the ADC is coupled to an input of the DAC. In one or more embodiments, the differential integrator circuit further comprises the ADC is a flash ADC. In one or more embodiments, the differential integrator circuit further comprises the DAC is a switched-capacitor type. In one or more embodiments, the differential integrator circuit further comprises the DAC is coupled to an input of the discrete-time integrator circuit.

Another aspect of the invention is directed to a delta-sigma analog-to-digital converter comprising: a first integrator circuit operating in sampling and integration phases, the first integrator circuit comprising: a positive integrator input voltage; a negative integrator input voltage; an op amp having an inverting input, a non-inverting input, an inverting output and a non-inverting output; a first sampling capacitor; a first integration capacitor; and a first non-switched capacitor. The delta-sigma analog-to-digital converter further comprises an analog-to-digital converter having an ADC input coupled to the inverting output and the non-inverting output of the op amp; and a digital-to-analog converter having a DAC input coupled to an ADC output of the analog-to-digital converter, wherein: the first integration capacitor is coupled between the inverting input and the non-inverting output of the op amp, the first non-switched capacitor is coupled between the negative integrator input voltage and the inverting input of the op amp, during the sampling phase, the positive integrator input voltage is coupled to the first sampling capacitor, and during the integration phase, a charge sampled across the first sampling capacitor during the sampling phase is transferred to the first integration capacitor.

In one or more embodiments, the delta-sigma analog-to-digital converter further comprises a second integrator circuit having a first output and a second output, wherein the first output is in electrical communication with the positive integrator input voltage and the second output is in electrical communication with the negative integrator input voltage. In one or more embodiments, the second integrator is a discrete-time integrator. In one or more embodiments, the second integrator is a continuous-time integrator.

In one or more embodiments, the delta-sigma analog-to-digital converter further comprises a discrete-time integrator circuit having a first output and a second output; and a continuous-time integrator, wherein the first output of the discrete-time integrator circuit is in electrical communication with the positive integrator input voltage and the second output of the discrete-time integrator circuit is in electrical communication with the negative integrator input voltage, a positive output of the continuous-time integrator is in electrical communication with a positive input of the discrete-time integrator circuit, and a negative output of the continuous-time integrator is in electrical communication with a negative input of the discrete-time integrator circuit.

BRIEF DESCRIPTION OF THE DRAWINGS

For a fuller understanding of the nature and advantages of the present concepts, reference is made to the following detailed description of preferred embodiments and in connection with the accompanying drawings. In the drawings, like reference characters generally refer to like features (e.g., functionally-similar and/or structurally-similar elements).

DETAILED DESCRIPTION

High order delta-sigma A/D converters are desirable because they provide high SNR at a low OSR, but they must be stabilized by at least one zero in the transfer function. Prior art delta-sigma converters employ feedback or feed-forward topologies to provide the zeros. However, they incur a penalty in additional circuitry such as additional D/A converters or another operational amplifier. In view of the foregoing, various inventive embodiments disclosed herein generally relate to delta-sigma converter circuits that provide feed-forward for loop stability without adding substantial complexity to the circuit.

Following below are more detailed descriptions of various concepts related to, and embodiments of, inventive apparatus relating to non-switched capacitor circuits for delta-sigma ADCS. It should be appreciated that various concepts introduced above and discussed in greater detail below may be implemented in numerous ways, as the disclosed concepts are not limited to any particular manner of implementation. Examples of specific implementations and applications are provided primarily for illustrative purposes.

Figure 1:
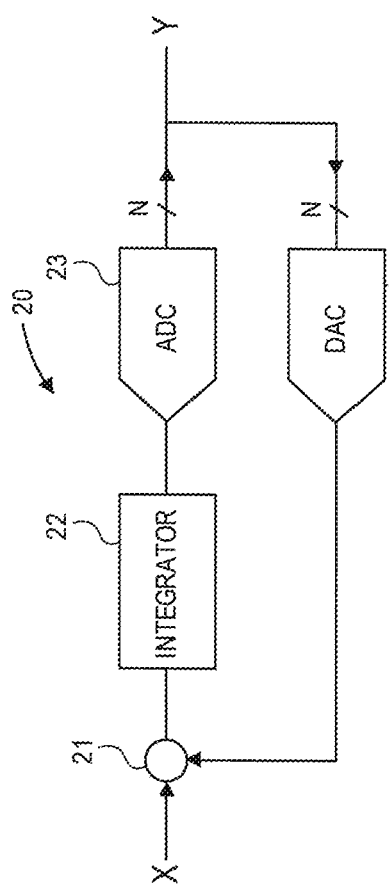
FIG. 1 is a schematic illustration of a first order discrete-time delta-sigma converter 20 according to the prior art.

FIG. 1 is a schematic illustration of a first order discrete-time delta-sigma converter 20 according to the prior art. The converter 20 includes an analog subtractor 21, a discrete time integrator 22, an A/D converter 23, and a D/A converter 24. Typically, both the A/D converter and the D/A converter have only 1 to 5 bits of resolution. The signal X represents the analog input voltage, and the signal Y represents the digital output. The discrete-time integrator 22 has the following transfer function:

$$H(z) = \frac{z^{-1}}{1 - z^{-1}} \quad (1)$$

Figure 2:
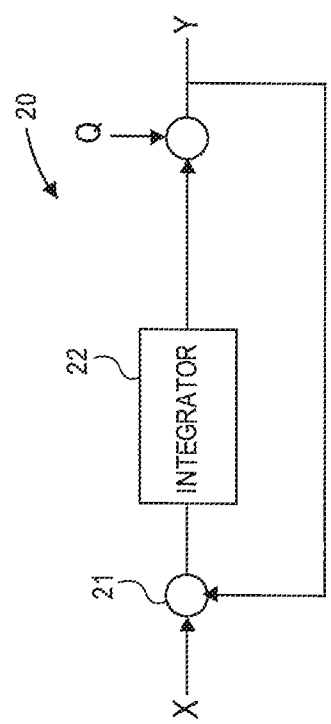
FIG. 2 is a schematic illustration of an approximate linear model of the first order discrete-time delta-sigma converter illustrated in FIG. 1, according to the prior art.

Since the A/D converter and the D/A converter are nonlinear elements, the precise mathematical modeling of the delta-sigma converter 20 is extremely complicated. FIG. 2 is a schematic illustration of an approximate linear model of the first order discrete-time delta-sigma converter 20 according to the prior art. The approximate linear model is often utilized to gain intuition on the operation of delta-sigma converters. In the linear model, the ADC 23 and DAC 24 pair is modeled as a direct path with quantization noise Q added. Mathematically, it can be shown from FIG. 2 that the digital output Y is given by:

$$Y = z^{-1}X + (1 - z^{-1})Q \quad (2)$$

which indicates that the digital output is the sum of the delayed input plus first-order differentiated quantization noise. The quantization noise is referred to as having been "first-order noise-shaped" by the first-order differentiation. The noise shaping suppresses low-frequency quantization noise by the differentiation. By digitally low-pass filtering the digital output, the in-band quantization noise in the output signal Y is reduced as compared to standard (non-noise shaped) quantization. In non-noise shaped quantization, the in-band quantization noise $Q_b$ is shown to be $$Q_b = \frac{Q_t}{(OSR)^{\frac{1}{2}}} \quad (3)$$

where $Q_t$ is the total quantization noise before low pass filtering, and OSR is the oversampling ratio given by:

$$OSR = \frac{f_s}{2f_b} \quad (4)$$

where $f_s$ is the sampling frequency and $f_b$ is the signal bandwidth. Thus, 2× oversampling provides $\sqrt{2}$ or 3 dB reduction of in-band quantization noise. 256× oversampling provides 24 dB reduction in in-band quantization noise. It can be shown that the first order noise-shaped quantization yields in-band quantization noise of $$Q_b = \frac{Q_t}{(OSR)^{\frac{3}{2}}} \quad (5)$$

Thus, 2× and 256× oversampling yields 9 dB and 72 dB reduction of in-band quantization noise, respectively, which is much more effective in providing high SNR compared with the non-noise shaped quantizer.

In typical embodiments of delta-sigma ADCS, the discrete-time integrator 22 has a transfer function $$H(z) = \frac{kz^{-1}}{1 - z^{-1}} \quad (6)$$

where the value k is not unity, but determined by a ratio between a sampling capacitor and an integration capacitor in the switched-capacitor integrator as illustrated below.

Mathematically, it can be shown that the digital output Y is:

$$Y = H(z)X + G(z)Q \quad (7)$$

where $$H(z) = \frac{kz^{-1}}{1 + (k-1)z^{-1}} \quad (8)$$

and $$G(z) = \frac{1 - z^{-1}}{1 + (k-1)z^{-1}} \quad (9)$$

The transfer function H(z) from the input to the output has a low-pass characteristic. Therefore, in the signal band which is limited to low frequency, the input signal is not substantially attenuated, and the digital output is an accurate representation of the analog input. The transfer function G(z) from the quantization noise to the output has a high-pass characteristic; thus the quantization noise is reduced (first-order shaped) in the signal band.

Figure 3:
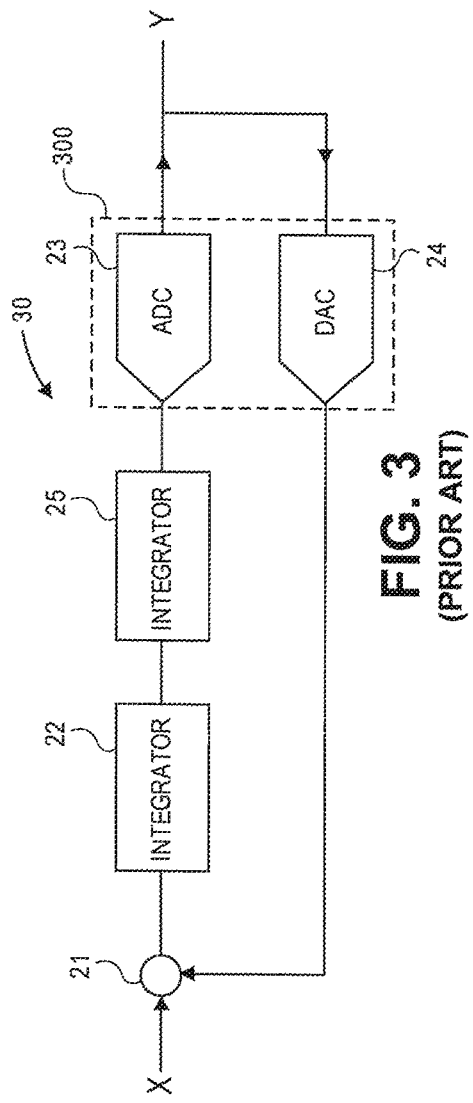
FIG. 3 is a schematic illustration of a linear model of a second-order delta-sigma ADC according to the prior art.
Figure 4:
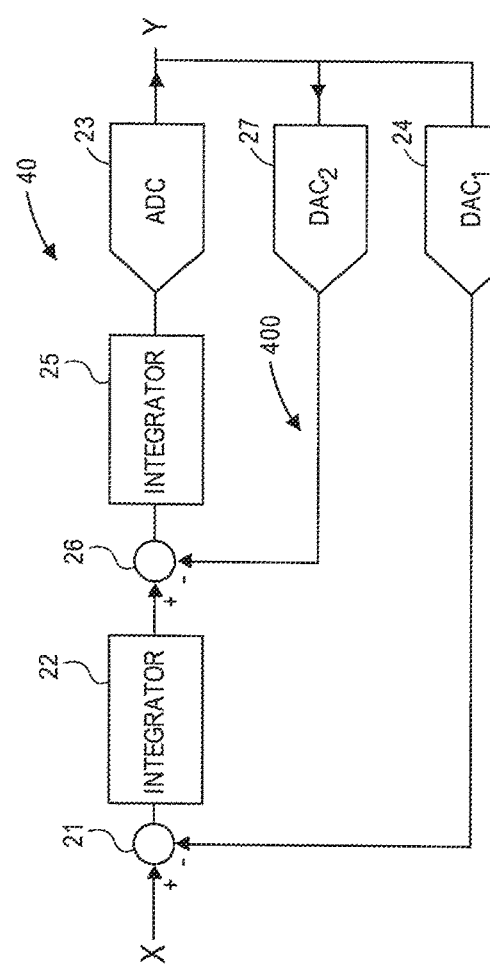
FIG. 4 is a schematic illustration of a second order delta-sigma ADC with an additional feedback path for loop stability, according to the prior art.

Obviously, higher-order noise shaping can reduce the in-band quantization noise even further. FIG. 3 is a schematic illustration of a second-order delta-sigma ADC 30 according to the prior art. In FIG. 3, the second-order delta-sigma ADC includes two integrators 22 and 25. While the second order delta-sigma ADC theoretically provides higher order noise shaping and lower in-band quantization noise, the issue is the loop stability. It can be shown that the two discrete-time integrators connected in series contribute a phase delay of at least $2\pi$, thus the loop becomes unstable. The delay through the quantizer 300 (the ADC 23 and DAC 24 pair) adds more phase delay and exacerbates the stability. One way to ensure stability in higher order delta-sigma ADCS is to insert feedforward or feedback paths that reduce the phase shift around the loop's cross-over frequency. For example, the delta-sigma ADC 40 in FIG. 4 employees an additional feedback path 400 to the input of the second integrator 25. This additional path 400 facilitates a loop around the second integrator 25 at high frequencies with correspondingly lower phase delay. The drawback is that the additional feedback path 400 requires an additional DAC 27 and an additional subtractor 26, thus increasing complexity and power consumption.

Figure 5:
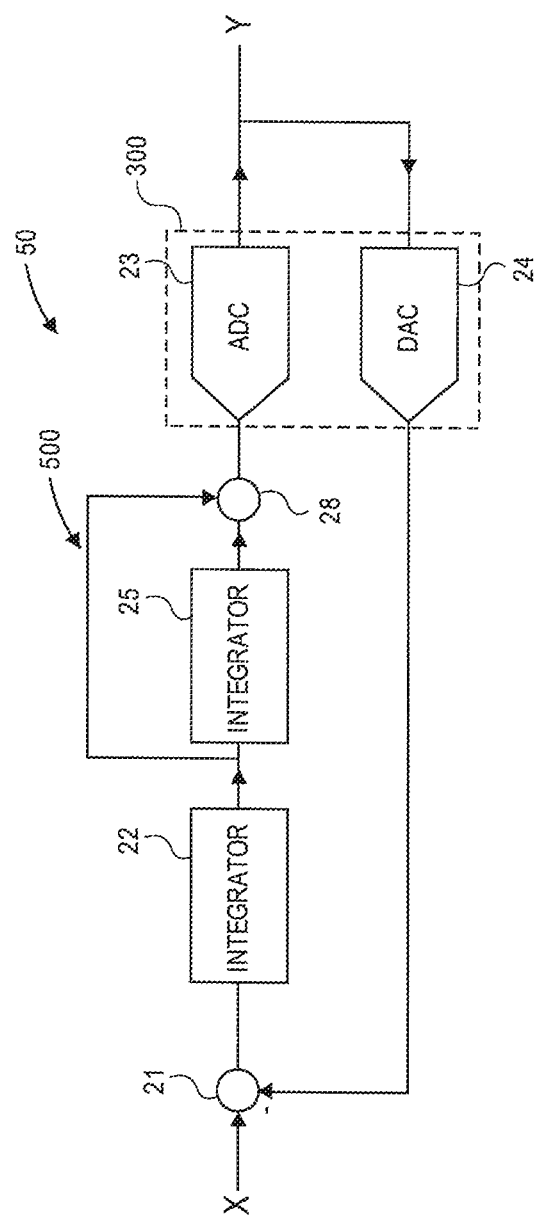
FIG. 5 is a schematic illustration of a second order delta-sigma ADC with an additional feedforward path for loop stability, according to the prior art.

Another example is shown in FIG. 5, which is a schematic illustration of a second order delta-sigma ADC 50 with an additional feedforward path 500 for loop stability where the feedforward path 500 is inserted from the output of the first integrator 22 to the input of the quantizer 300. The feedforward path 500 provides a loop around only the first integrator 22 at high frequencies bypassing the second integrator 25, and thus has a lower phase delay. The drawback is that an analog summing circuit 28 is needed at the input of the quantizer 300, which is typically implemented using an op amp, again increasing complexity and power consumption.

Figure 6:
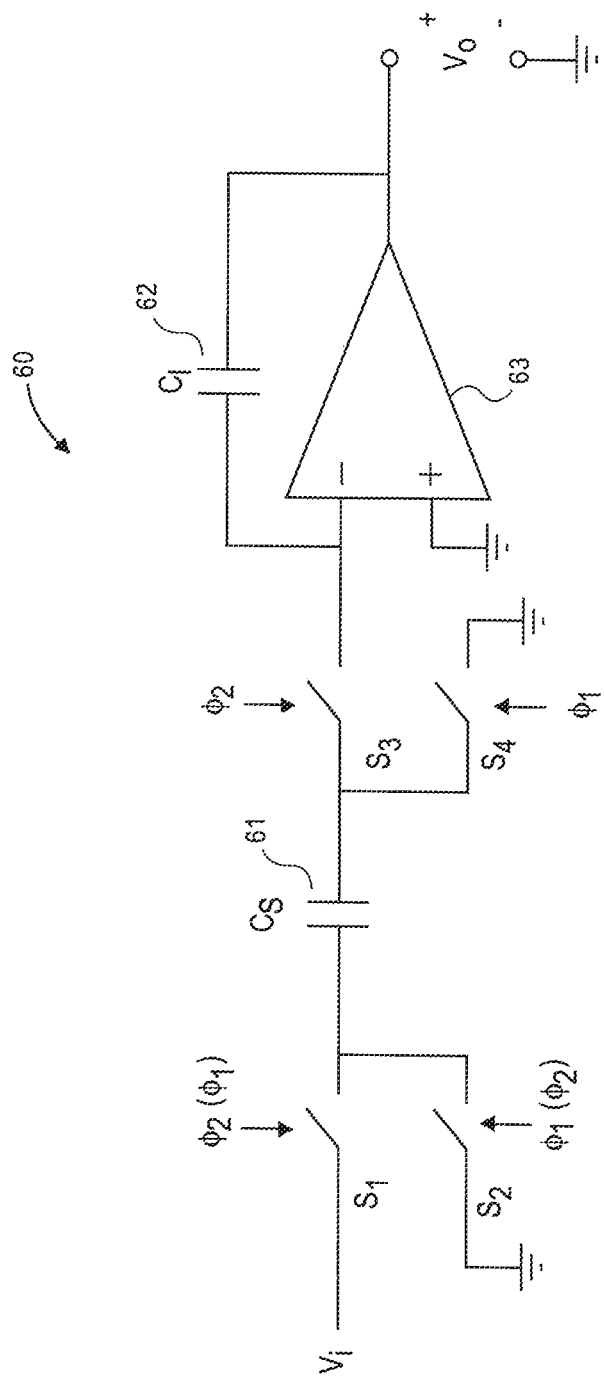
FIG. 6 is a schematic illustration of a switched-capacitor integrator according to the prior art.

The discrete-time integrators such as the ones in FIGS. 2, 3, 4, and 5 are typically implemented in a switched-capacitor form. An example of a switched-capacitor integrator 60 is shown in FIG. 6 comprising a sampling capacitor 61, an integrating capacitor 62, an operational amplifier (op amp) 63, and switches $S_1$ through $S_4$. It operates off two non-overlapping clock phases $\phi_1$ and $\phi_2$. Two different clocking schemes can be chosen; In the first scheme, the clock phases $\phi_1$ and $\phi_2$ without the parentheses are used. In the second scheme, the clock phases $\phi_1$ and $\phi_2$ within the parentheses are used. Each of the switches $S_1$ through $S_4$ is closed when corresponding clock phase ($\phi_1$ or $\phi_2$) shown next to the switch is high; otherwise, it is open. For example, in the circuit in FIG. 6, when the first clocking scheme (clock signals without the parentheses) is employed, switches $S_2$ and $S_4$ are closed when $\phi_1$ is high, and switches $S_1$ and $S_3$ are closed when $\phi_2$ is high. When $\phi_1$ is high, sampling capacitor $C_S$ is discharged. When $\phi_2$ is high, the input voltage $v_i$ is applied to $C_S$, resulting in a transfer function $$H(z) = \frac{V_o}{V_i} = -\frac{C_S}{C_I} \cdot \frac{1}{1 - z^{-1}} \quad (10)$$

This transfer function corresponds to a delayless inverting integrator.

In some instances, a delayed integration of the input signal is desired, which can be achieved by using the second clocking scheme (clock signals $\phi_1$ and $\phi_2$ within the parentheses) in FIG. 6. The switches $S_1$ and $S_4$ are closed when $\phi_1$ is high, and switches $S_2$ and $S_3$ are closed when $\phi_2$ is high. When $\phi_1$ is high, the input voltage $v_i$ is sampled across the sampling capacitor $C_S$. When $\phi_2$ is high, the sampled charge is transferred to the integrating capacitor $C_I$. The resulting transfer function is given by $$H(z) = \frac{V_o}{V_i} = -\frac{C_S}{C_I} \cdot \frac{z^{-1}}{1-z^{-1}} \qquad (11)$$

This transfer function corresponds to a non-inverting integrator with a full delay.

Figure 7:
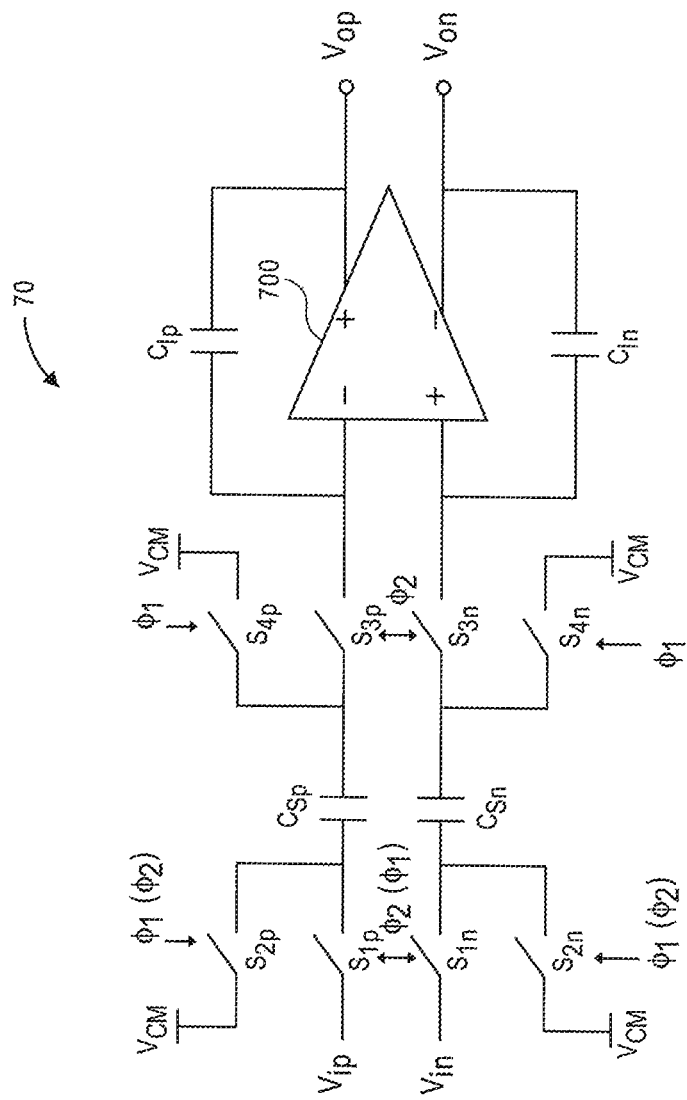
FIG. 7 is a schematic illustration of a fully-differential switched-capacitor integrator according to the prior art.

FIG. 7 is a schematic illustration of a fully-differential switched-capacitor integrator 70 according to the prior art. The fully-differential switched-capacitor integrator 70 is a fully-differential version of integrator 60 in FIG. 6. In the fully-differential switched-capacitor integrator 70, $V_{CM}$ is the system common-mode voltage. The sampling capacitors $C_{Sp}$ and $C_{Sn}$ in integrator 70 are the same as sampling capacitor $C_S$ in integrator 60 (i.e., $C_{Sp}=C_{Sn}=C_S$), and the integrating capacitors $C_{Ip}$ and $C_{In}$ in integrator 70 are the same as integrating capacitor $C_I$ in integrator 60 (i.e., $C_{Ip}=C_{In}=C_I$).

As with the switched-capacitor integrator 60 in FIG. 6, two different clocking schemes can be chosen; In the first scheme, the clock phases 4 and $\phi_2$ without the parentheses are used. In the second scheme, the clock phases $\phi_1$ and $\phi_2$ within the parentheses are used. Each of the switches $S_{1p}$ through $S_{4p}$ and $S_{1n}$ through $S_{4n}$ is closed when corresponding clock phase ($\phi_1$ or $\phi_2$) shown next to the switch is high; otherwise, it is open.

The difference between differential input voltages $v_{ip}$ and $v_{in}$ in integrator 70 is equal to the input voltage $v_i$ in integrator 60 (i.e., $v_{ip}$ and $v_{in}=v_{ip}-v_{in}$). Likewise, the difference between differential output voltages $v_{op}$ and $v_{on}$ in integrator 70 is equal to the output voltage $v_o$ in integrator 60 (i.e., $v_o=v_{op}-v_{on}$). differential output voltages $v_{op}$ and $v_{on}$ correspond to the positive and negative outputs of op amp 700. Delayless inverting integration is performed if clock phasing without the parentheses is employed, and delayed noninverting integration is performed if clock phasing within the parentheses is employed. In fully-differential integrators such as the one shown in FIG. 7, the polarity inversion is obtained by swapping either the inputs $v_{ip}$ and $v_{in}$, or the outputs $v_{op}$ and $v_{on}$, thus either inverting or noninverting integration can be achieved with or without delay.

Figure 8:
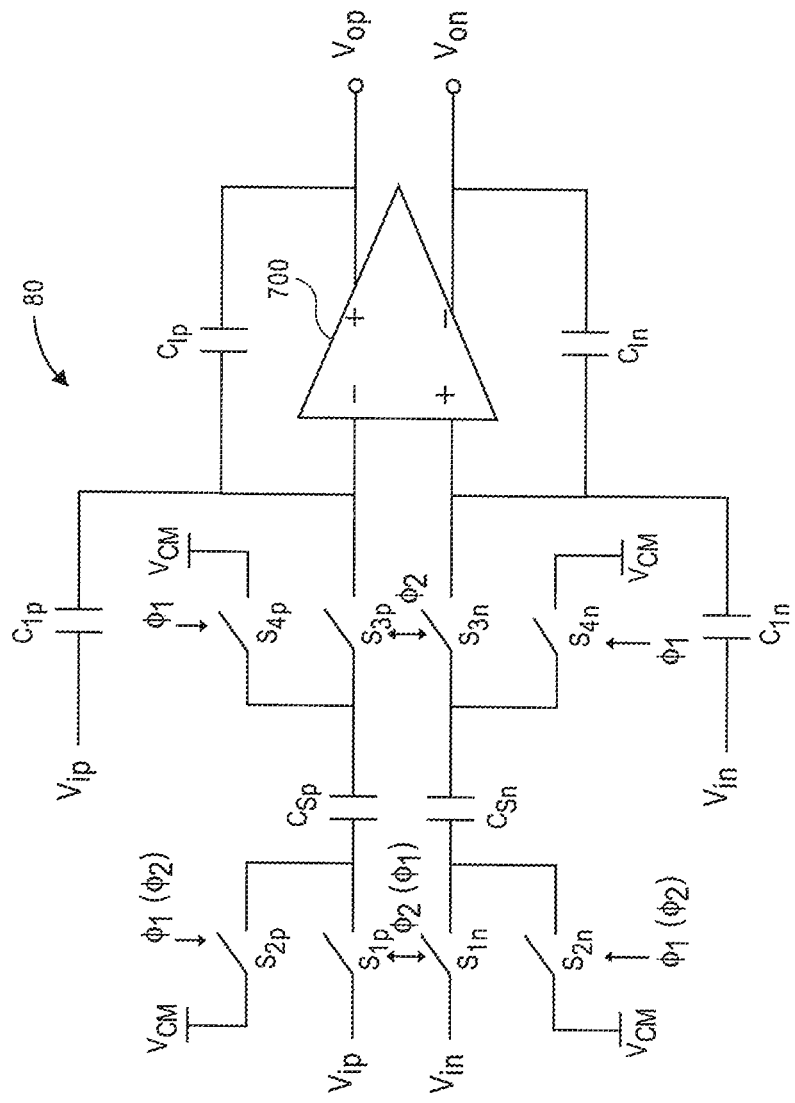
FIG. 8 is a schematic illustration of a fully-differential switched-capacitor integrator with a zero in the transfer function according to the prior art.

In some applications, it is desirable to have a zero in the transfer function of the integrator, primarily for better loop stability. FIG. 8 is a schematic illustration of a fully-differential switched-capacitor integrator 80 with a zero according to the prior art. It is similar to integrator 70 in FIG. 7, but non-switched capacitors $C_{1p}$ and $C_{1n}$ are added to integrator 80. Non-switched capacitors $C_{1p}$ and $C_{1n}$ in integrator 80 are equal to integrating capacitor $C_I$ in integrator 60 (i.e., $C_{1p}=C_{1n}=C_1$). As with the fully-differential switched-capacitor integrator 70 in FIG. 7, two different clocking schemes can be chosen; In the first scheme, the clock phases $\phi_1$ and $\phi_2$ without the parentheses are used. In the second scheme, the clock phases $\phi_1$ and $\phi_2$ within the parentheses are used. Each of the switches $S_{1p}$ through $S_{4p}$ and $S_{1n}$ through $S_{4n}$ is closed when corresponding clock phase ($\phi_1$ or $\phi_2$) shown next to the switch is high; otherwise, it is open.

If clock phasing without parentheses is employed, the resulting transfer function of the integrator 80 is given by:

$$H(z) = \frac{V_o}{V_i} = -\frac{C_S}{C_I} \cdot \frac{z^{-1}}{1-z^{-1}} - \frac{C_1}{C_I} = -\frac{1}{C_I} \cdot \frac{C_S + C_1 - C_1 z^{-1}}{1-z^{-1}} \qquad (12)$$

Compared with the transfer function of the integrator in Equation (11), which has a pole at z=1 and no zero in the transfer function, the additional capacitor $C_1$ provides a zero at $$z = \frac{C_1}{C_S + C_1}$$

in the transfer function of the integrator 80. Since the zero is within the unit circle in the complex plane, it raises the phase as frequency rises towards the sampling frequency, and improves the stability in a feedback loop that employs such an integrator.

On the other hand, if clock phasing in the parentheses is employed, the resulting transfer function of the integrator 80 is given by:

$$H(z) = \frac{V_o}{V_i} = \frac{C_S}{C_I} \cdot \frac{z^{-1}}{1-z^{-1}} - \frac{C_1}{C_I} = -\frac{1}{C_I} \cdot \frac{C_1 - (C_S + C_1)z^{-1}}{1-z^{-1}} \qquad (13)$$

In this case, the zero is outside the unit circle in the complex plane, and it lowers the phase as frequency rises towards the sampling frequency, exacerbating stability. Therefore, this clock phasing is not suitable for improving stability of a feedback loop that employs such an integrator. Integrator 80 is disclosed in A. Pertijs, et. al., "A CMOS Smart Temperature Sensor With a 3σ Inaccuracy of +0.1° C. From −55° C. to 125° C.," IEEE Journal of Solid-State Circuits, pp. 2805-2815, vol. SC-40, No. 12, December 2005, which is hereby incorporated by reference.

There are instances where delayed integration is desired with a zero inside the unit circle. Such need arises typically in high-order delta-sigma ADCS. In high-order delta-sigma ADCS, high-order noise shaping is achieved by cascading integrators. For an optimum loop transfer function, delayless and delayed integrators are often alternated. In such cases, a delayed integrator with a zero inside the unit circle may be desired. However, such an integrator is unavailable in the prior art.

Figure 9:
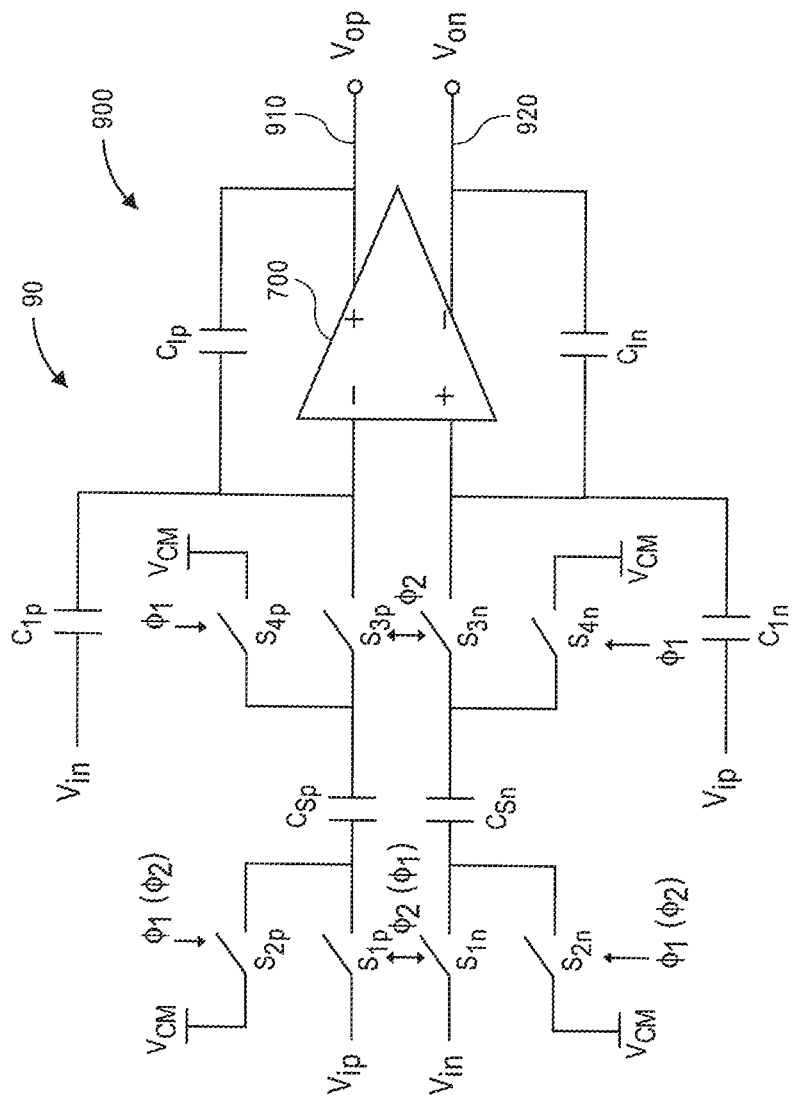
FIG. 9 is a schematic illustration of a fully-differential switched-capacitor delayed integrator with a transfer function that includes a zero within the unit circle in the complex plane, according to one or more embodiments of the invention.

FIG. 9 is a schematic illustration a fully-differential switched-capacitor delayed integrator 90 with a transfer function that includes a zero within the unit circle in the complex plane, according to one or more embodiments of the invention. In contrast to integrator 80 in FIG. 8, the non-switched capacitors $C_{1p}$ and $C_{1n}$ are connected to the opposite polarity inputs such that non-switched capacitor $C_{1p}$ receives the negative input voltage $v_{in}$ instead of the positive input voltage $v_{ip}$ (as in integrator 80), and non-switched capacitor $C_{1N}$ receives the positive input voltage $v_{ip}$ instead of the negative input voltage $v_{in}$ (as in integrator 80). The integrator 90 includes first and second outputs 910, 920, which correspond to positive and negative differential output voltages $v_{op}$ and $v_{on}$, respectively. The first output 910 is in electrical communication with the positive input voltage $v_{ip}$ and the second output 920 is in electrical communication with the negative input voltage $v_{in}$. The first and second outputs 910, 920 are also coupled to the outputs of discrete-time integrator 900.

As with integrator 80 in FIG. 8, two different clocking schemes can be chosen; In the first scheme, the clock phases $\phi_1$ and $\phi_2$ without the parentheses are used. In the second scheme, the clock phases $\phi_1$ and $\phi_2$ within the parentheses are used. Each of the switches $S_{1p}$ through $S_{4p}$ and $S_{1n}$ through $S_{4n}$ is closed when corresponding clock phase ($\phi_1$ or $\phi_2$) shown next to the switch is high; otherwise, it is open.

Using clock phasing inside the parenthesis, the resulting transfer function is given by:

$$H(z) = \frac{V_o}{V_i} = \frac{C_S}{C_I} \cdot \frac{z^{-1}}{1-z^{-1}} + \frac{C_1}{C_I} = -\frac{1}{C_I} \cdot \frac{C_1 + (C_S - C_1)z^{-1}}{1 - z^{-1}} \quad (14)$$

Compared with the transfer function of integrator 80 in Equation (13) which has a pole at z=1 and a zero that is outside the unit circle in the complex plane when clock phasing in the parentheses is employed, the additional capacitors $C_{1p}=C_{1n}=C_1$ provide a zero at $$z = \frac{C_1 - C_S}{C_1}.$$

Since the zero is inside the unit circle in the complex plane, it raises the phase as frequency rises towards the sampling frequency, and thus improves stability. In certain applications, delayless integration with a zero outside the unit circle in the complex plane may be desired despite the fact that stability is compromised. In such cases, clock phasing without the parenthesis can be used to yield a transfer function:

$$H(z) = \frac{V_o}{V_i} = -\frac{C_S}{C_I} \cdot \frac{1}{1-z^{-1}} + \frac{C_1}{C_I} = \frac{1}{C_I} \cdot \frac{C_1 - (C_S - C_1)z^{-1}}{1 - z^{-1}} \quad (15)$$

Figure 10:
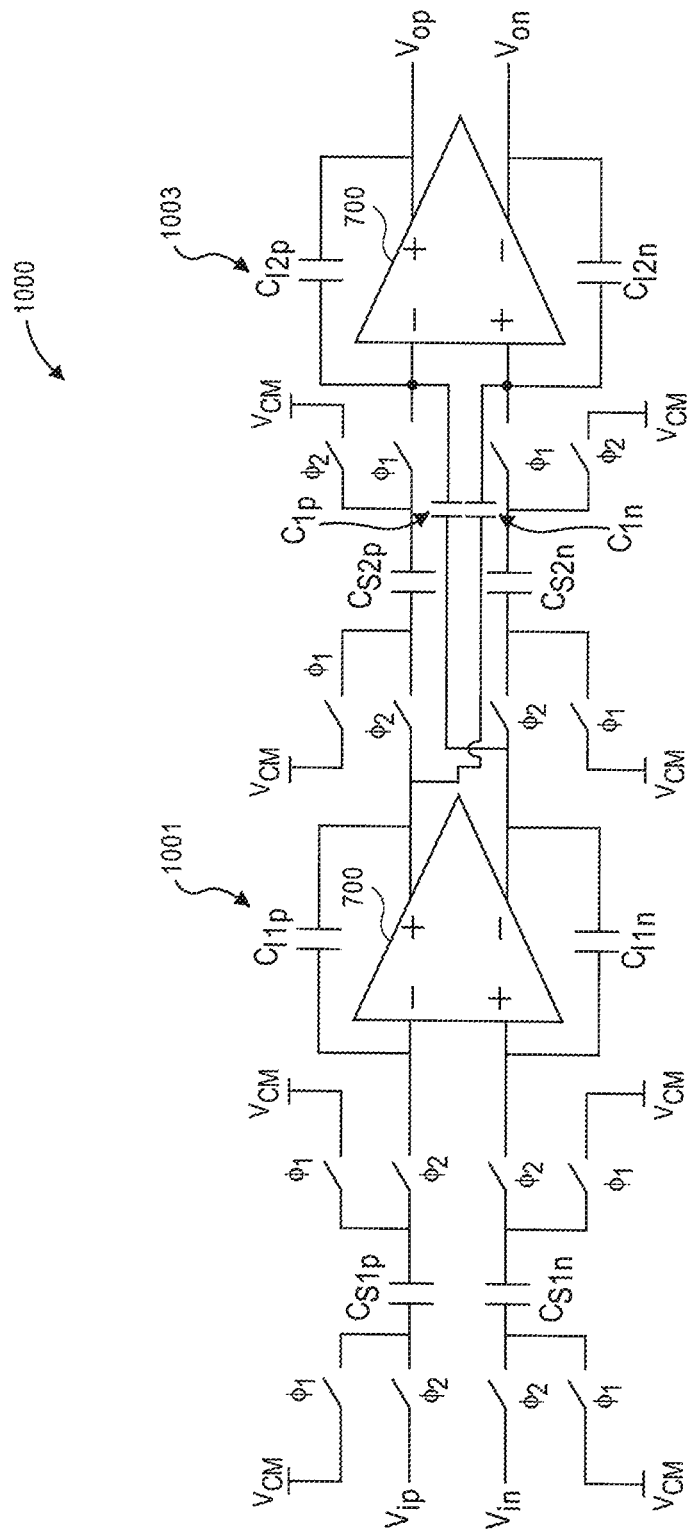
FIG. 10 is a schematic illustration of a circuit that includes a cascade of a fully-differential switched-capacitor delayless integrator and a fully-differential switched-capacitor delayed integrator, according to one or more embodiments of the invention.

FIG. 10 is a schematic illustration of a circuit 1000 that includes a cascade of a fully-differential switched-capacitor delayless integrator 1001 and a fully-differential switched-capacitor delayed integrator 1003, according to one or more embodiments of the invention. The delayless integrator 1001 is cascaded with a delayed integrator 1003. Such a cascade effectively eliminates the phase error in discrete-time integration. The delayed integrator 1003 (e.g., a discrete time integrator) has additional non-switched capacitors $C_{1p}$ and $C_{1n}$ to implement a zero inside the unit circle in the complex plane. Various switches in FIG. 10 are closed when corresponding clock phase ($\phi_1$ or $\phi_2$) shown next to a switch is high; otherwise, they are open. The transfer function $$H(z) = \frac{v_1}{v_i}$$

has a two-series integration with a zero $$z = \frac{C_1 - C_S}{C_1},$$

which is inside the unit circle in the complex plane. Clock phasing without the parenthesis yields the following transfer function:

$$H(z) = \frac{V_o}{V_i} = -\frac{C_{S1}}{C_{I1}} \cdot \frac{z^{-1}}{1-z^{-1}} \left( \frac{C_{S2}}{C_{I2}} \cdot \frac{1}{1-z^{-1}} - \frac{C_1}{C_{I2}} \right) = \quad (16)$$

$$-\frac{C_{S1}}{C_{I1}} \cdot \frac{z^{-1}}{C_{I2}} \cdot \frac{C_{S2} + C_1 - C_1 z^{-1}}{(1 - z^{-1})^2}$$

Figure 11:
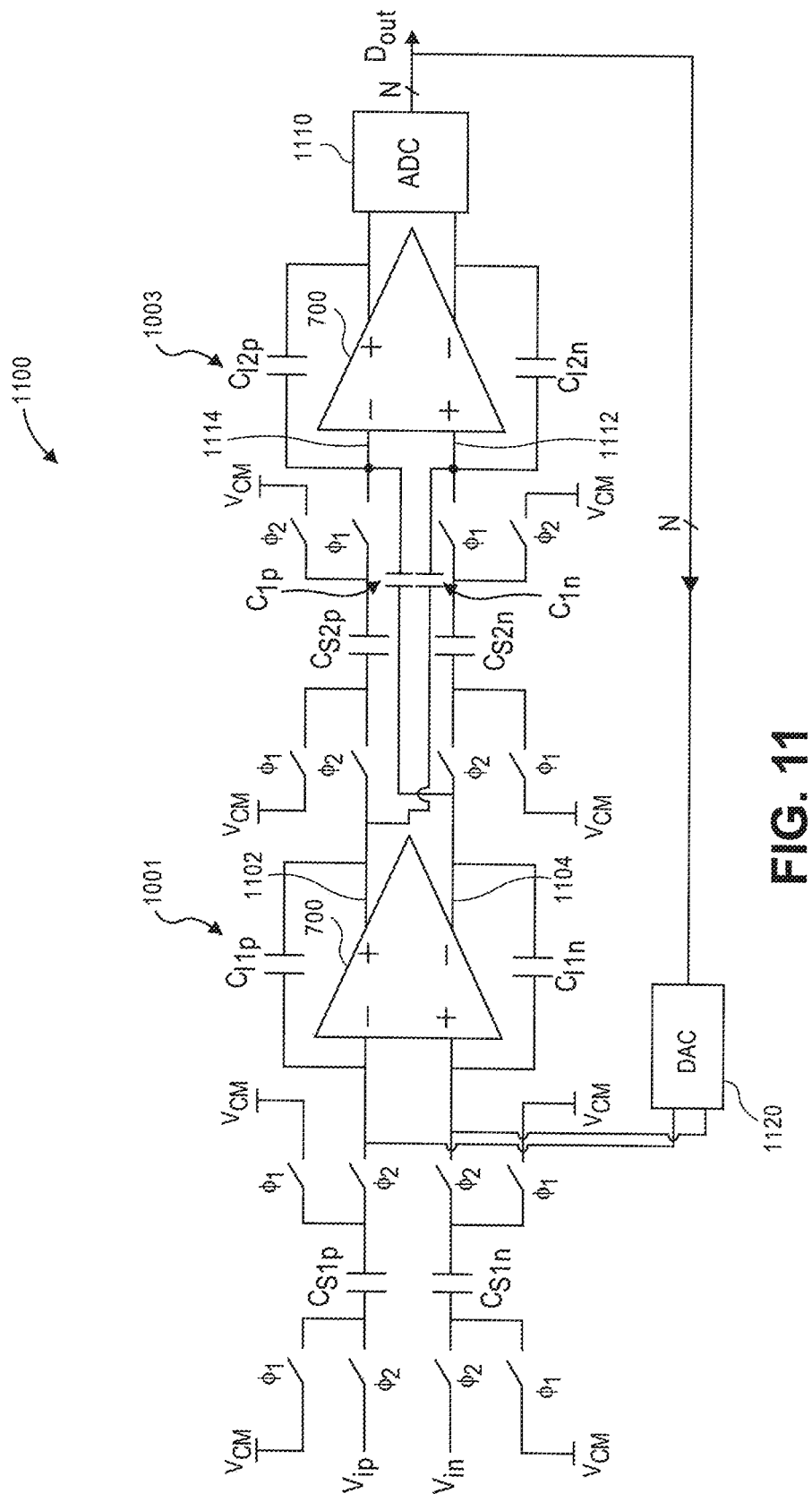
FIG. 11 illustrates a second order delta-sigma ADC according to one or more embodiments of the invention.

FIG. 11 illustrates another embodiment of the invention, showing a second order delta-sigma ADC 1100. As in FIG. 10, a delayless integrator 1001 is cascaded with a delayed integrator 1003 (e.g., a discrete time integrator). The delayless integrator 1001 has first and second outputs 1102, 1104, respectively. The first output 1102 is in electrical communication with a positive integrator input 1112 of the delayed integrator 1003, and the second output 1104 is in electrical communication with a negative integrator input 1114 of the delayed integrator 1003.

Such a cascade effectively eliminates the phase error in discrete-time integration. The non-switched capacitors $C_{1p}$ and $C_{1n}$ implement a zero inside the unit circle. Various switches in FIG. 11 are closed when corresponding clock phase ($\phi_1$ or $\phi_2$) shown next to a switch is high; otherwise, they are open. An analog-to-digital converter (ADC) 1110, preferably a flash-type ADC, produces a digital output. The output of the ADC 1110 is electrically coupled to the input of a digital-to-analog converter (DAC) 1120. The digital output of ADC 110 is the converted back to analog by DAC 1120, preferably a switched-capacitor type. The DAC 1120 is coupled to the input of the first integrator 1001 to complete the delta-sigma ADC 1100 loop.

The forward transfer function $$H(s) = \frac{v_1}{v_i}$$

has two-series integration with a zero $$z = \frac{C_1 - C_S}{C_1},$$

as in the cascaded integrators in FIG. 10, which is inside the unit circle in the complex plane. At high frequencies, the zero raises the phase thus making the loop more stable in the delta-sigma ADC 1100. This effectively provides a feedforward path without requiring an analog summing circuit at the input of the quantizer (e.g., as in ADC 50). The ratio between $C_S$ and $C_1$ are selected to place the zero at an optimum frequency for stability and noise shaping. The lower the zero frequency, the more stable the loop becomes (e.g., higher phase margin). However, the noise shaping is compromised due to the zero resulting in a lower SNR for a given OSR.

Figure 12:
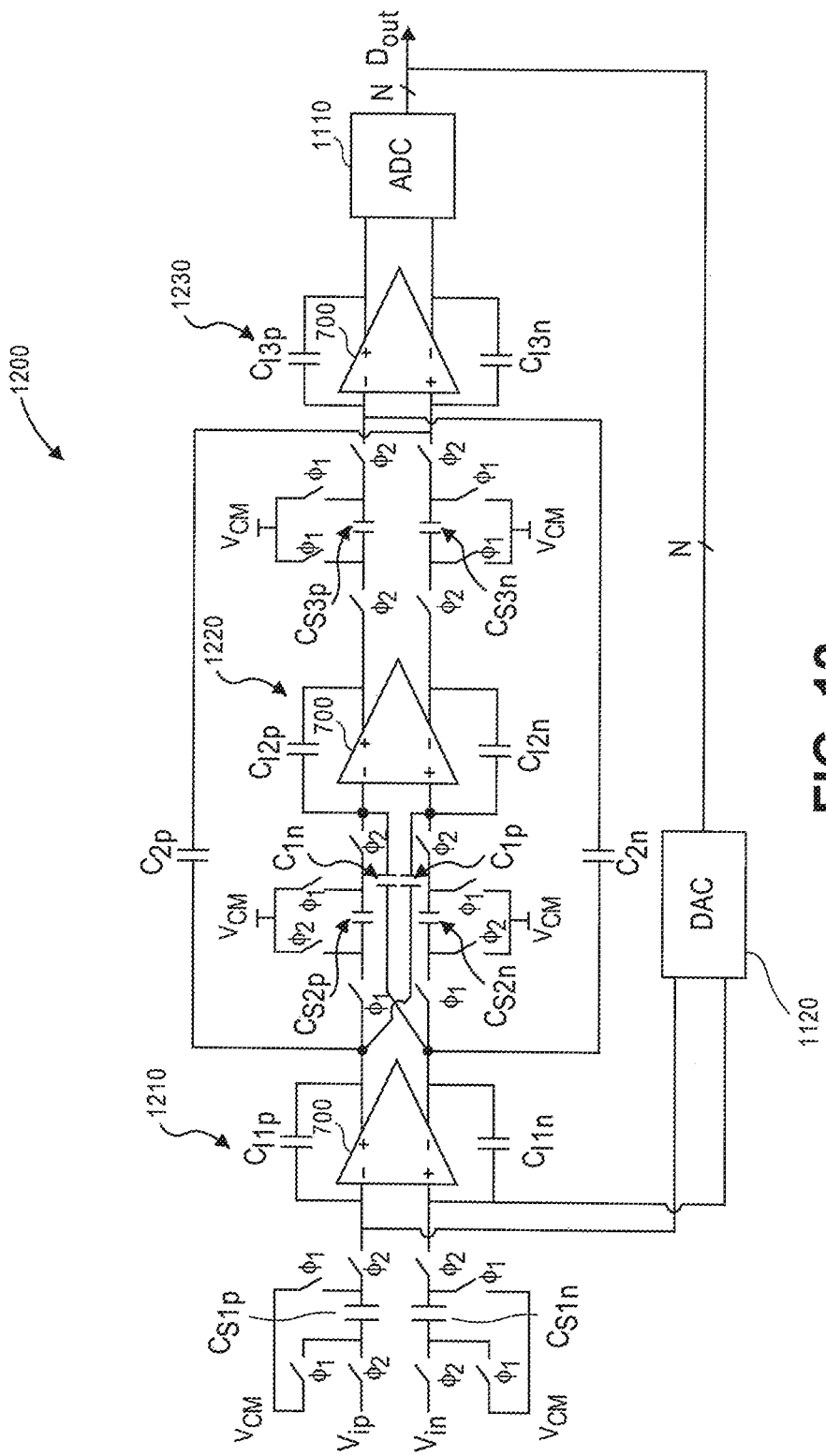
FIG. 12 shows a third order delta-sigma ADC according to one or more embodiments of the invention.

FIG. 12 illustrates another embodiment of the invention, a third order delta-sigma ADC 1200. Two pairs of non-switched capacitors $C_{1p}$ and $C_{1n}$ couple the positive and negative outputs of the first integrator 1210 and the noninverting and inverting inputs, respectively, of the op amp 700 of the second integrator 1220, and non-switched capacitors $C_{2p}$ and $C_{2n}$ couple the positive and negative outputs of the first integrator 1210 and the noninverting and inverting inputs, respectively, of the op amp 700 of the third integrator 1230 to implement two zeros inside the unit circle in the complex plane. In FIG. 12, the first and third integrators 1210, 1230 are delayless integrators and the second integrator 1220 is a delayed integrator. Various switches in FIG. 12 are closed when corresponding clock phase ($\phi_1$ or $\phi_2$) shown next to a switch is high; otherwise, they are open.

Figure 13:
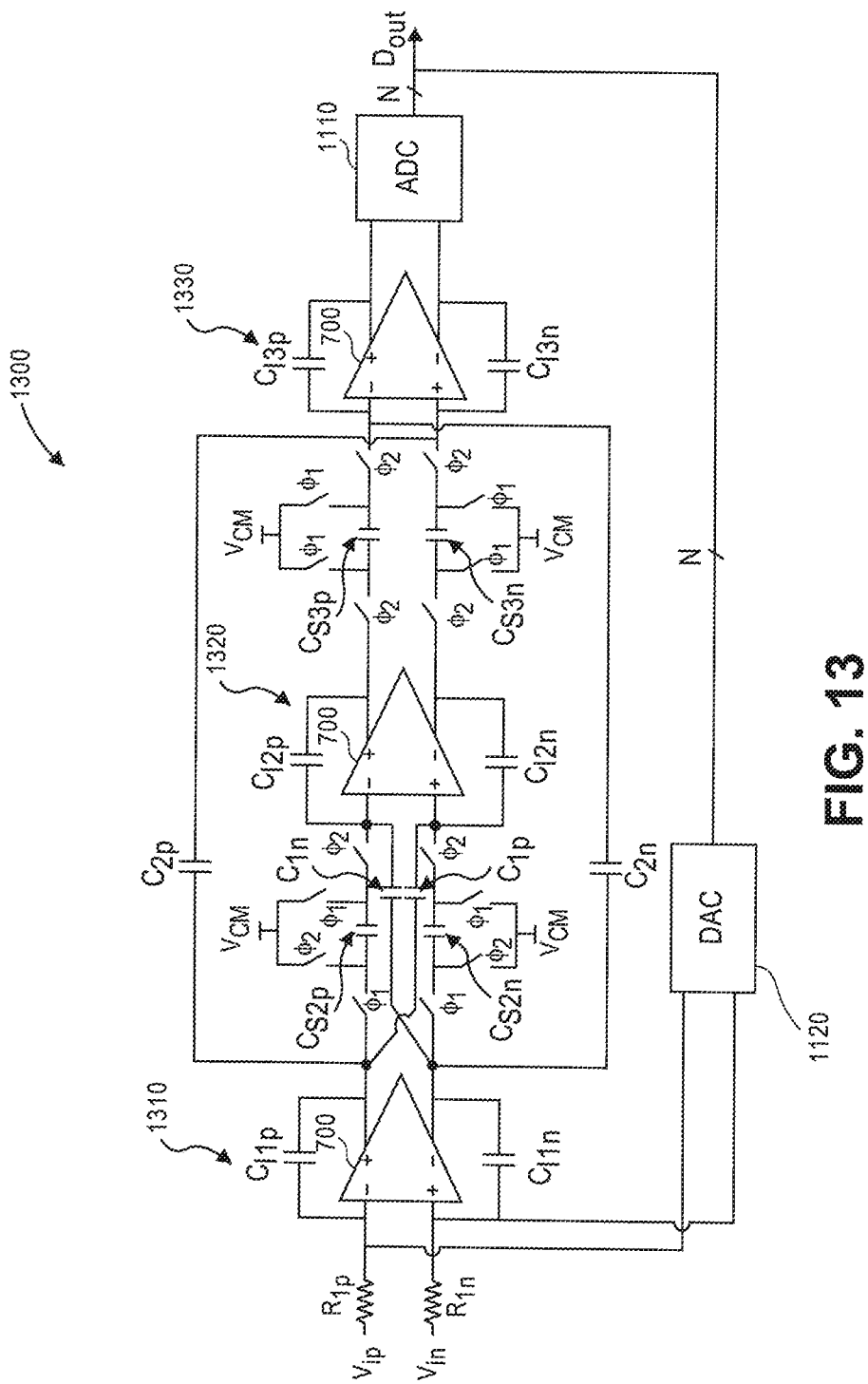
FIG. 13 shows a continuous-time and discrete-time hybrid third order delta-sigma ADC according to one or more embodiments of the invention.

FIG. 13 shows another embodiment of the invention, a third order delta-sigma ADC 1300, where the first stage is a continuous-time integrator 1310. Two pairs of non-switched capacitors $C_{1p}$ and $C_{1n}$ couple the positive and negative outputs of the first integrator 1310 and the noninverting and inverting inputs, respectively, of the op amp 700 of the second integrator 1320, and non-switched capacitors $C_{2p}$ and $C_{2n}$ couple the positive and negative outputs of the first integrator 1310 and the noninverting and inverting inputs, respectively, of the op amp 700 of the third integrator 1330 to implement two zeros inside the unit circle in the complex plane. In FIG. 13, the third integrator 1330 is a delayless integrator and the second integrator 1320 is a delayed integrator. Various switches in FIG. 13 are closed when corresponding clock phase ($\phi_1$ or $\phi_2$) shown next to a switch is high; otherwise, they are open.

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

The invention should not be considered limited to the particular embodiments described above, but rather should be understood to cover all aspects of the invention as fairly set out in the attached claims. Various modifications, equivalent processes, as well as numerous structures to which the invention may be applicable, will be apparent to those skilled in the art to which the invention is directed upon review of this disclosure. The claims are intended to cover such modifications and equivalents.

What is claimed is:

1. A differential integrator circuit operating in sampling and integration phases, comprising:
   a positive input voltage;
   a negative input voltage;
   an op amp having an inverting input, a non-inverting input, an inverting output, and a non-inverting output;
   a first sampling capacitor;
   a first integration capacitor; and
   a first non-switched capacitor,
   wherein:
      the first integration capacitor is coupled between the inverting input and the non-inverting output of the op amp,
      the first non-switched capacitor is coupled between the negative input voltage and the inverting input of the op amp,
      during the sampling phase, the positive input voltage is coupled to the first sampling capacitor, and
      during the integration phase, a charge sampled across the first sampling capacitor during the sampling phase is transferred to the first integration capacitor.

2. The differential integrator circuit in claim 1 further comprising:
   a second sampling capacitor;
   a second integration capacitor; and
   a second non-switched capacitor,
   wherein:
      the second integration capacitor is coupled between the non-inverting input and the inverting output of the op amp,
      the second non-switched capacitor is coupled between the positive input voltage and the non-inverting input of the op amp,
      during the sampling phase, the negative input voltage is coupled to the second sampling capacitor, and
      during the integration phase, a charge sampled across the second sampling capacitor is transferred to the second integration capacitor.

3. The differential integrator circuit in claim 2 further comprising:
   a discrete-time integrator circuit having first and second outputs,
   wherein the first output is in electrical communication with the positive input voltage and the second output is in electrical communication with the negative input voltage.

4. The differential integrator circuit in claim 3 wherein the discrete-time integrator circuit is a delayless integrator.

5. The differential integrator circuit in claim 3 further comprising:
   an analog-to-digital converter (ADC); and
   a digital-to-analog converter (DAC),
   wherein:
      the ADC is coupled to the inverting output and the non-inverting output of the op amp, and
      an output of the ADC is coupled to an input of the DAC.

6. The differential integrator circuit in claim 5 wherein the ADC is a flash ADC.

7. The differential integrator circuit in claim 5 wherein the DAC is a switched-capacitor type.

8. The differential integrator circuit in claim 5 wherein the DAC is coupled to an input of the discrete-time integrator circuit.

9. A delta-sigma analog-to-digital converter comprising:
   a first integrator circuit operating in sampling and integration phases, the first integrator circuit comprising:
      a positive integrator input voltage;
      a negative integrator input voltage;
      an op amp having an inverting input, a non-inverting input, an inverting output and a non-inverting output;
      a first sampling capacitor;
      a first integration capacitor; and
      a first non-switched capacitor;
   an analog-to-digital converter having an ADC input coupled to the inverting output and the non-inverting output of the op amp; and
   a digital-to-analog converter having a DAC input coupled to an ADC output of the analog-to-digital converter,
   wherein:

the first integration capacitor is coupled between the inverting input and the non-inverting output of the op amp, the first non-switched capacitor is coupled between the negative integrator input voltage and the inverting input of the op amp, during the sampling phase, the positive integrator input voltage is coupled to the first sampling capacitor, and during the integration phase, a charge sampled across the first sampling capacitor during the sampling phase is transferred to the first integration capacitor.

10. The delta-sigma analog-to-digital converter of claim 9 further comprising:

a second integrator circuit having a first output and a second output, wherein the first output is in electrical communication with the positive integrator input voltage and the second output is in electrical communication with the negative integrator input voltage.

11. The delta-sigma analog-to-digital converter of claim 10 wherein the second integrator is a discrete-time integrator.

12. The delta-sigma analog-to-digital converter of claim 10 wherein the second integrator is a continuous-time integrator.

13. The delta-sigma analog-to-digital converter of claim 9 further comprising:

a discrete-time integrator circuit having a first output and a second output; and a continuous-time integrator, wherein:

the first output of the discrete-time integrator circuit is in electrical communication with the positive integrator input voltage and the second output of the discrete-time integrator circuit is in electrical communication with the negative integrator input voltage, a positive output of the continuous-time integrator is in electrical communication with a positive input of the discrete-time integrator circuit, and a negative output of the continuous-time integrator is in electrical communication with a negative input of the discrete-time integrator circuit.

* * * * *